United States Patent
Kang et al.

(10) Patent No.: US 7,791,935 B2
(45) Date of Patent: Sep. 7, 2010

(54) METHOD FOR DRIVING A PHASE CHANGE MEMORY DEVICE USING VARIOUS WRITE CONDITIONS

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 139 days.

(21) Appl. No.: 12/146,587

(22) Filed: Jun. 26, 2008

(65) Prior Publication Data
US 2009/0040816 A1 Feb. 12, 2009

(30) Foreign Application Priority Data
Aug. 10, 2007 (KR) .................. 10-2007-0080658

(51) Int. Cl.
*G11C 11/00* (2006.01)
(52) U.S. Cl. ..................... 365/163; 365/148
(58) Field of Classification Search .......... 365/163, 365/148, 189.16
See application file for complete search history.

(56) References Cited
U.S. PATENT DOCUMENTS

| | | | |
|---|---|---|---|
| 7,639,526 B2 * | 12/2009 | Pellizzer et al. | 365/163 |
| 2006/0126380 A1 * | 6/2006 | Osada et al. | 365/163 |
| 2007/0236987 A1 * | 10/2007 | Cho et al. | 365/163 |
| 2007/0274121 A1 * | 11/2007 | Lung et al. | 365/148 |

FOREIGN PATENT DOCUMENTS
KR 100764738 B1 10/2007

\* cited by examiner

*Primary Examiner*—Vu A Le
(74) *Attorney, Agent, or Firm*—Ladas & Parry LLP

(57) ABSTRACT

A phase change memory device includes a phase change resistor configured to sense a change in crystallization state due to current flow in order to store data that corresponds to the crystallization state. The phase change memory device is driven by reading cell data of a selected unit cell using a reference current. The cell data is compared to write data and then it is determined whether the write data is set data or reset data if the cell data is different from the write data. The set or reset state is written to the cell and verified during a write and verification operation under various conditions to stably write the data.

23 Claims, 21 Drawing Sheets

<Prior Art>

METHOD FOR DRIVING A PHASE CHANGE MEMORY DEVICE USING VARIOUS WRITE CONDITIONS

CROSS-REFERENCE TO RELATED APPLICATIONS

This application is based upon and claims the benefit of priority to Korean Patent Application No. 10-2007-80658, filed on Aug. 10, 2007, the entire contents of which are incorporated herein by reference.

BACKGROUND OF THE INVENTION

The present invention relates to a method for driving a phase change memory device, and more particularly, to a technology for changing a write condition when an initial cell has a different write characteristic in order to perform a normal write operation.

Nonvolatile memory, including magnetic memory and phase change memory (PCM), has a data processing speed similar to that of volatile Random Access Memory (RAM) and conserves data even after power is turned off.

FIGS. 1a and 1b are diagrams showing a conventional phase change resistor (PCR) 4.

The PCR 4 comprises a phase change material (PCM) 2 formed between a top electrode 1 and a bottom electrode 3. A high temperature is generated in the PCM 2 when a voltage and a current are transmitted causing an electric conductive state change depending on the resistance of the PCM 2. The PCM may include AgLnSbTe. The PCM 2 includes chalcogenide having chalcogen elements (S, Se, Te) as a main ingredient, and more specifically a germanium antimonic tellurium (Ge2Sb2Te5) consisting of Ge—Sb—Te.

FIGS. 2a and 2b are diagrams showing a principle of the conventional PCR 4.

As shown in FIG. 2a, the PCM 2 can be crystallized when a low current less than a threshold value flows in the PCR 4. As a result, the PCM 2 is crystallized as a low resistant material.

As shown in FIG. 2b, the PCM 2 has a temperature higher than a melting point when a high current more than a threshold value flows in the PCR 4. As a result, the PCM 2 becomes amorphous as a high resistant material.

In this way, the PCR 4 is configured to store nonvolatile data which corresponds to the two resistance states. Data "1" refers to when the PCR 4 is at a low resistance state and data "0" refers to when the PCR 4 is at a high resistance state. As a result, the logic states of the two data can be stored.

FIG. 3 is a diagram showing a write operation of a conventional phase change resistant cell.

Heat is generated when current flows between the top electrode 1 and the bottom electrode 3 of the PCR 4 for a given period of time. As a result, the PCM 2 is changed to a crystalline or amorphous state depending on a temperature given to the top electrode 1 and the bottom electrode 3.

When a low current flows for a given time, the PCM 2 changes to a crystalline state due to low temperature heating so that the PCR 4, which is a low resistor, is at a set state. On the other hand, when a high current flows for a given time, the PCM 2 changes to an amorphous state due to high temperature heating so that the PCR 4, which is a high resistor, is at a reset state. A difference between two phases is represented by an electric resistance change.

A low voltage is applied to the PCR 4 for a long time to write the set state in a write mode. Conversely, a high voltage is applied to the PCR 4 for only a short time to write the reset state in the write mode.

FIG. 4 is a flow chart illustrating a write cycle operating method for a conventional phase change memory device. A conventional phase change memory device writes new data in a selected phase change resistor PCR when a write cycle starts (step S1). As a result, the number of reset and set write operations increases, thereby increasing power consumption that degrades a write characteristic of a cell.

FIG. 5 is a diagram showing a cell characteristic distribution of a conventional phase change memory device.

Each cell included in a plurality of cell arrays has a different read current distribution because process, device and design conditions are different for each cell. That is, the distribution of a set current Iset and a reset current Ireset becomes broader based on a read current.

Based on a reference current Iref, read currents may overlap each other in some cells. When the reset current Ireset and the set current Iset are distinguished by a single reference current Iref and the set current Iset and the reset current Ireset overlap, a fail condition occurs those cells.

SUMMARY OF THE INVENTION

Disclosed is a method for driving a phase change memory device.

Various embodiments are directed to reducing the number of reset and set operations in a phase change memory device including a phase change resistor to improve a write operating characteristic.

Various embodiments are directed to inducing set and reset write states to a stable region in a write mode.

Various embodiments are directed to stably driving set and reset write states to improve reliability of cells and a margin of a read sensing current.

Various embodiments are directed to changing a write condition when an initial cell write characteristic is different in order to obtain a normal set/reset write condition.

Various embodiments are directed to setting a value of a set reference current different from that of a reset reference current used for verifying a set write state in order to induce set and reset write states to a stable region in a write mode.

According to a first embodiment of the present invention, a method for driving a phase change memory device having a phase change resistor and sensing a change in a crystallization state of the phase change resistor according to currents applied to the phase change resistor to store data corresponding to resistance change comprises: reading cell data of a selected cell according to a reference current; comparing the cell data with write data to be written; deciding whether the write data is set data or reset data when the cell data is different from the write data; and writing and verifying a set state to the cell when the write data is set data, and writing and verifying a reset state to the cell when the write data is reset data.

According to a second embodiment of the present invention, a method for driving a phase change memory device having a phase change resistor and sensing a change in a crystallization state of the phase change resistor according to currents applied to the phase change resistor to store data corresponding to the crystallization state, the method comprises: reading cell data of a selected cell according to a read reference current; comparing the cell data with write data to be written; deciding whether the write data is set data or reset data when the cell data is different from the write data; and writing and verifying a set state to the cell according to a set reference current when the data is a set data, and writing and verifying a reset state to the cell according to a reset reference current when the data is a reset data.

DESCRIPTION OF SPECIFIC EMBODIMENTS

Figure 1A:
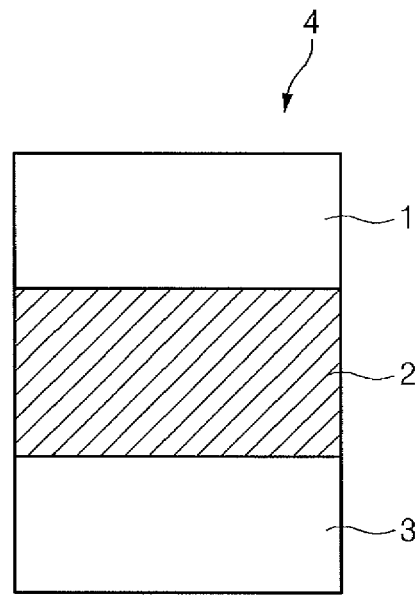
FIGS. 1a and 1b are diagrams showing a conventional phase change resistor.
Figure 1B:
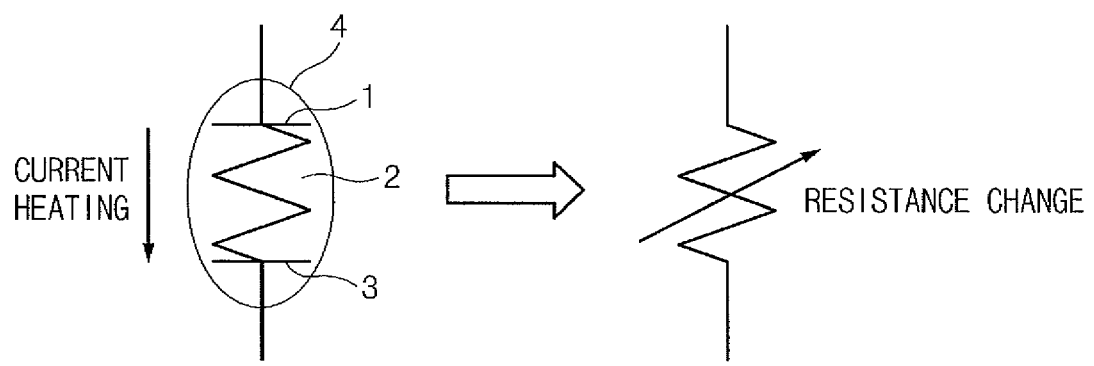
Figure 2A:
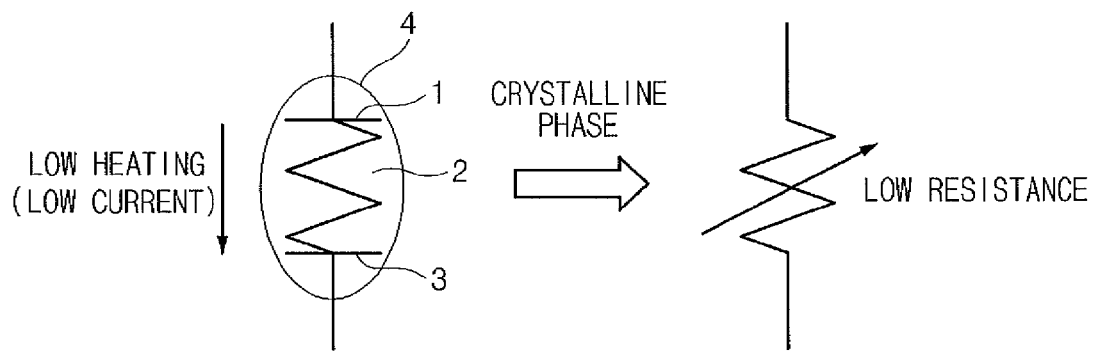
FIGS. 2a and 2b are diagrams showing a principle of the conventional phase change resistor.
Figure 2B:
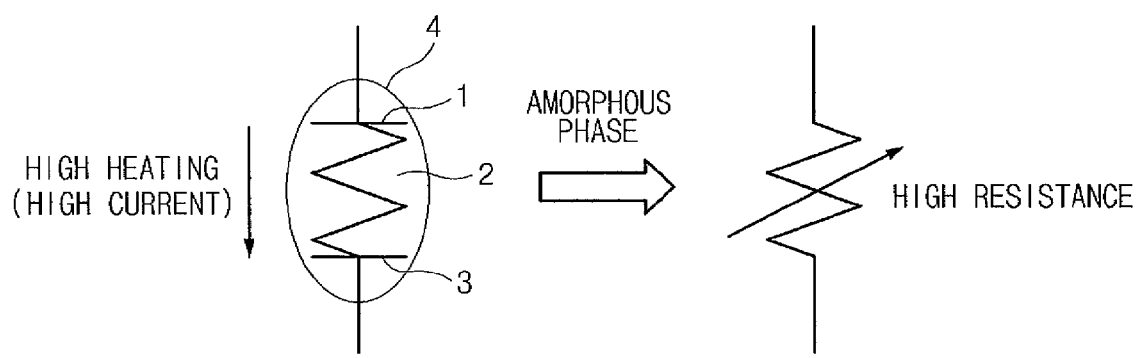
Figure 3:
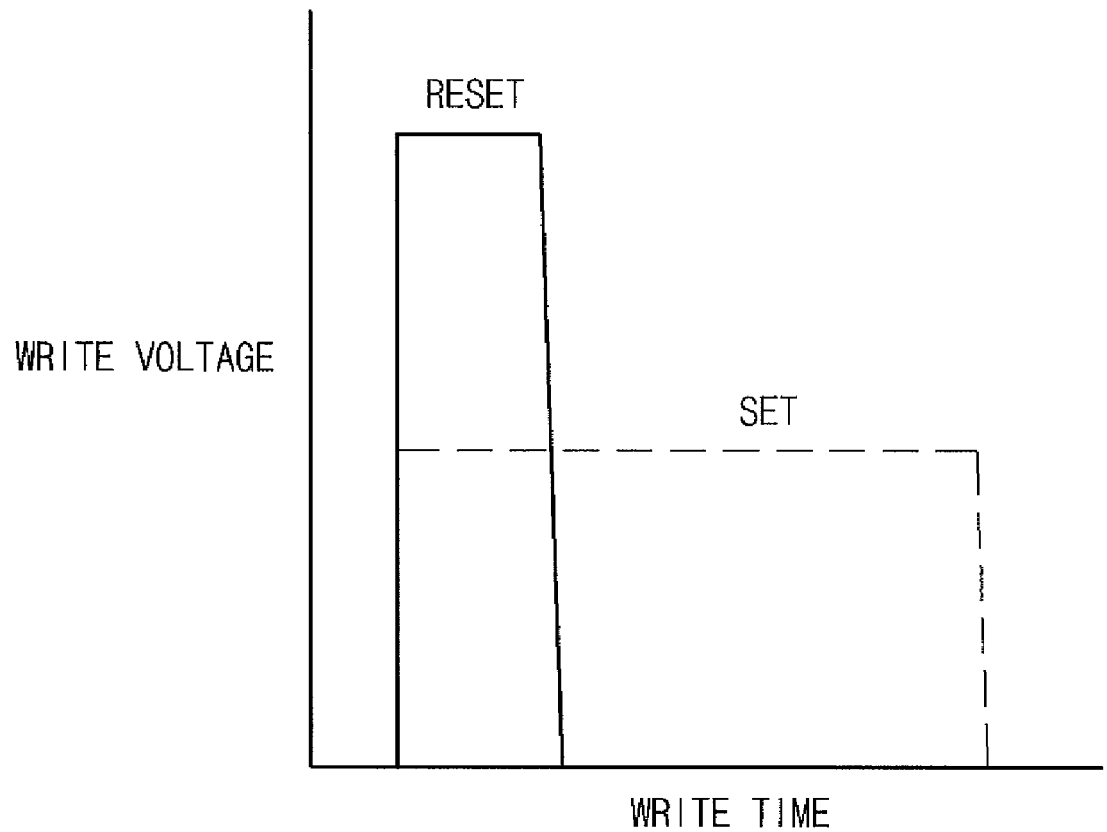
FIG. 3 is a diagram showing a write operation of a conventional phase change resistant cell.
Figure 4:
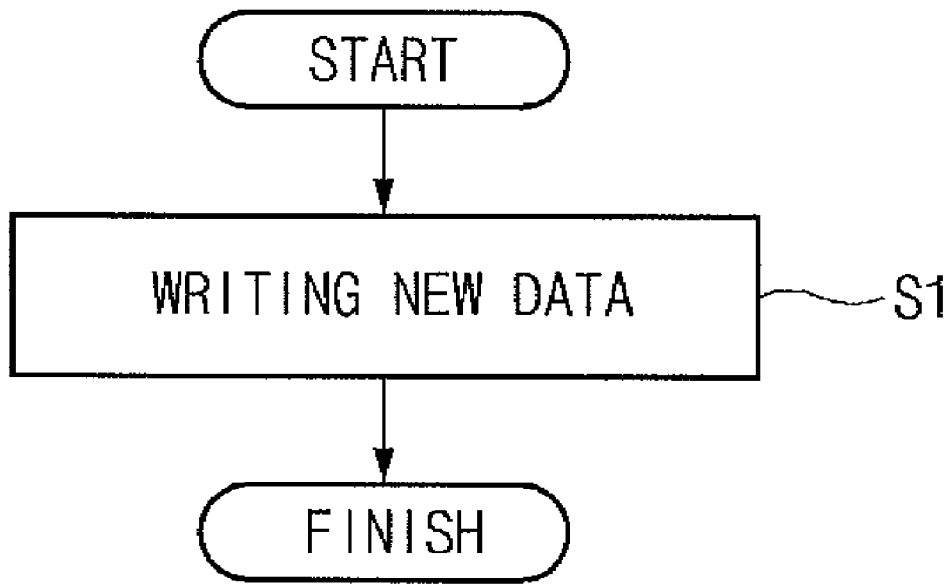
FIG. 4 is a flow chart illustrating a write cycle operating method of a conventional phase change memory device.
Figure 5:
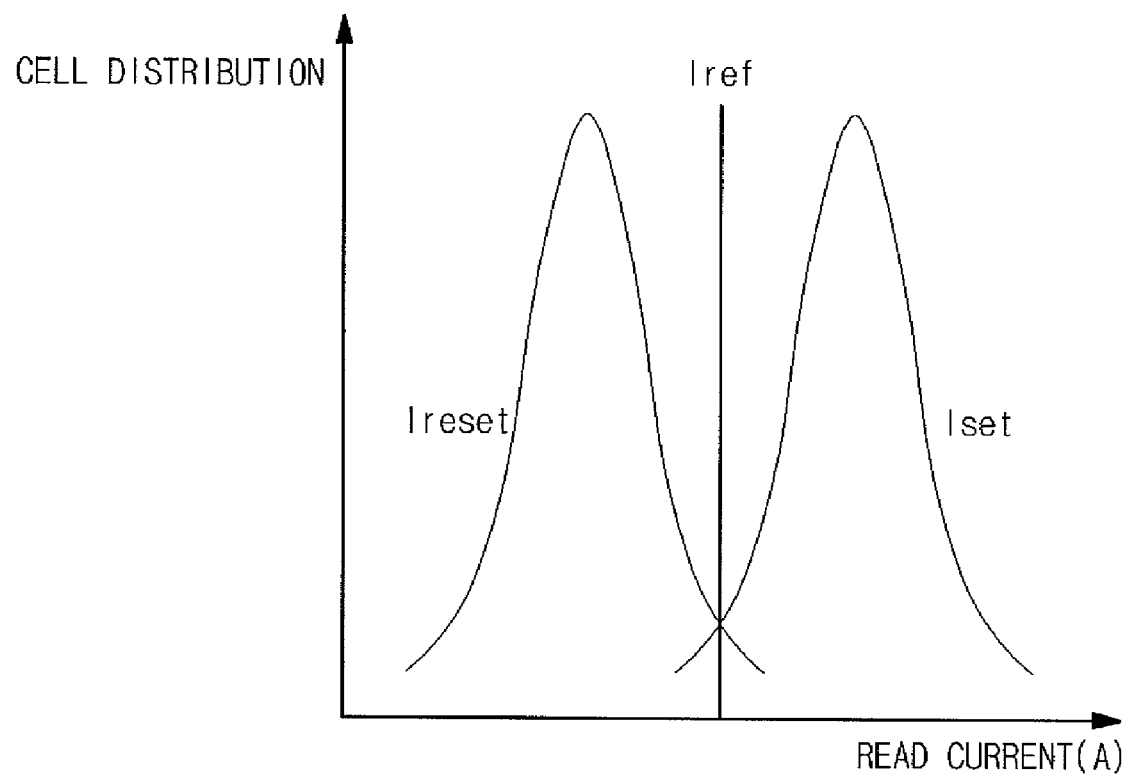
FIG. 5 is a diagram showing cell characteristic distribution of a conventional phase change memory device.
Figure 6:
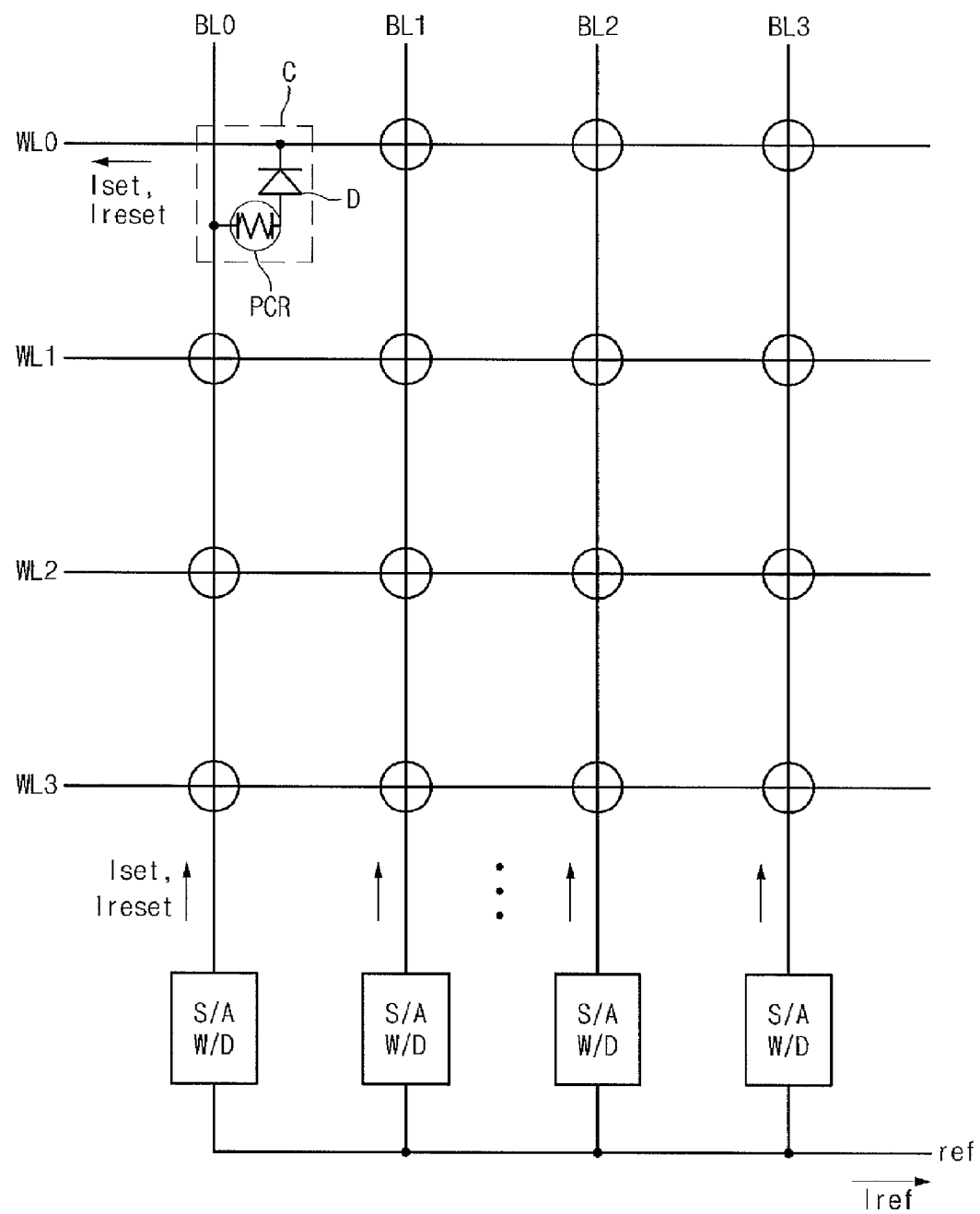
FIG. 6 is a diagram showing a cell array of a phase change memory device according to a first embodiment of the present invention.

FIG. 6 is a diagram showing a phase change memory device according to a first embodiment of the invention.

The phase change memory device includes a plurality of bit lines BL0~BL3 arranged in a row direction and a plurality of word lines WL0~WL3 arranged in a column direction. A unit cell C is arranged at an intersection of the bit lines BL0~BL3 and the word lines WL0~WL3. The unit cell C includes a phase change resistor PCR and a diode D. The diode D includes a PN diode element.

The phase change resistor PCR has one electrode connected to the bit line BL and the other electrode connected to a P-type region of the diode D. A N-type region of the diode D is connected to the word line WL.

A low voltage is applied to a selected word line WL in a read mode. A read voltage Vread is applied to the bit line BL so that a read current Iset having a set state and a read current Ireset having a reset state, flow toward the word line WL through the bit line BL, the phase change resistor PCR, and the diode D.

A sense amplifier S/A compares cell data received from the bit line BL with the reference current Iref received from a reference line ref to distinguish between data "1" and "0". A write driving unit W/D supplies a driving voltage that corresponds to write data to the bit line BL when data is to be written to the unit cell C.

Figure 7:
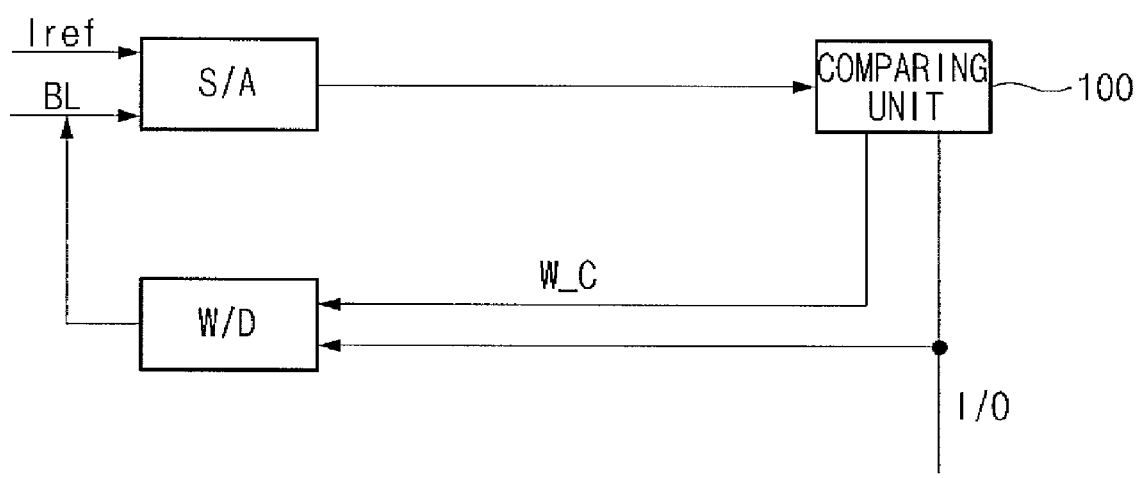
FIG. 7 is a diagram showing a sense amplifier, a write driving unit and a comparing unit of FIG. 6.

FIG. 7 is a diagram showing the sense amplifier S/A, the write driving unit W/D, and a comparing unit 100 of FIG. 6.

The sense amplifier S/A compares the reference current Iref to cell data received through the bit line BL. The write driving unit W/D supplies a driving voltage that corresponds to write data to the bit line BL when data is to be written to the cell. The comparing unit 100 compares cell read data outputted from the sense amplifier S/A with write data received from input/output lines I/O and outputs a write control signal W_C.

The comparing unit 100 deactivates the write control signal W_C when cell read data outputted from the sense amplifier S/A is identical to write data received from the input/output lines I/O. When the write control signal W_C is deactivated, operation of the write driving unit W/D is stopped.

The comparing unit 100 activates the write control signal W_C when the cell read data outputted from the sense amplifier S/A is different from the write data received from the input/output lines I/O. When the write control signal W_C is activated, the write driving unit W/D operates and writes new data through the bit line BL to the unit cell C.

Figure 8:
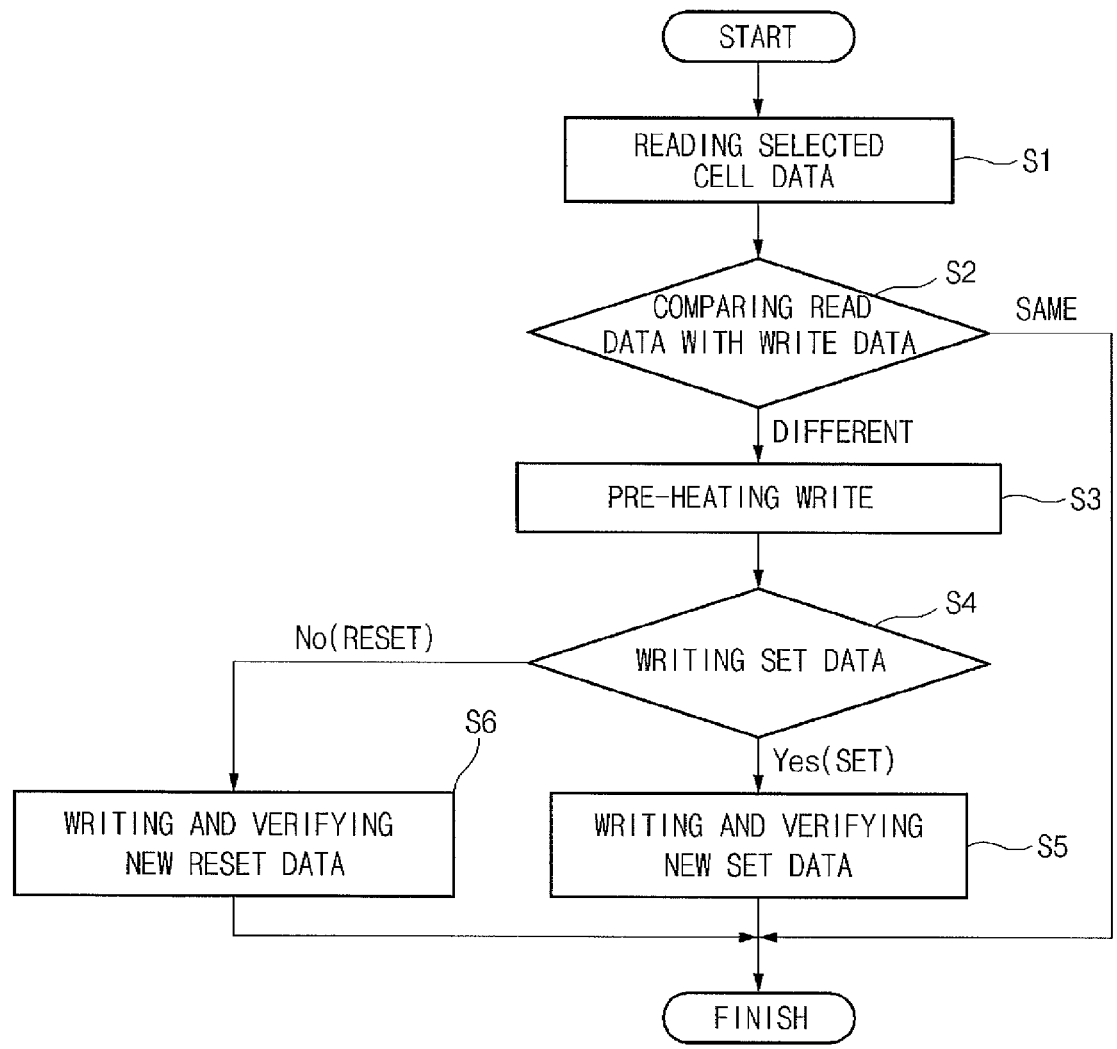
FIG. 8 is a flow chart illustrating a write cycle driving method of a phase change memory device according to a first embodiment of the present invention.

FIG. 8 is a flow chart illustrating a write cycle driving method of a phase change memory device according to a first embodiment of the present invention.

When a write cycle starts, original data stored in the selected unit cell C is read (step S1). Data of the unit cell C selected by the reference current Iref is read. The sense amplifier S/A compares the reference current Iref to cell data received through the bit line BL and amplifies the data.

That is, a low voltage is applied to the selected word line WL during a read mode. A read voltage Vread is transmitted to the bit line BL so that the set current Iset or the reset current Ireset flows towards the word line WL through the bit line BL, the phase change resistor PCR, and the diode D.

The comparing unit 100 compares read cell data read in the sense amplifier S/A to write data received from the input/output lines I/O and outputs the write control signal W_C (step S2).

The comparing unit 100 deactivates the write control signal W_C when the cell data outputted from the sense amplifier S/A has a logic value identical to that of the write data received from the input/output lines I/O. When the write control signal W_C is deactivated, the write driving unit W/D is stopped and does not write any new data.

When the data outputted from the sense amplifier S/A is identical to the write data received from the input/output lines I/O, the data to be written is already stored in the cell such that a new write operation does not need to be performed. As a result, the number of reset and set write operations can be reduced.

The comparing unit 100 activates the write control signal W_C when the cell data outputted from the sense amplifier S/A is not identical to a logic value of write data received from the input/output lines I/O. When the write control signal W_C is activated, the write driving unit W/D operates and writes new data through the bit line BL. The write driving unit W/D supplies a driving voltage that corresponds to write data to the bit line BL.

Figure 9:
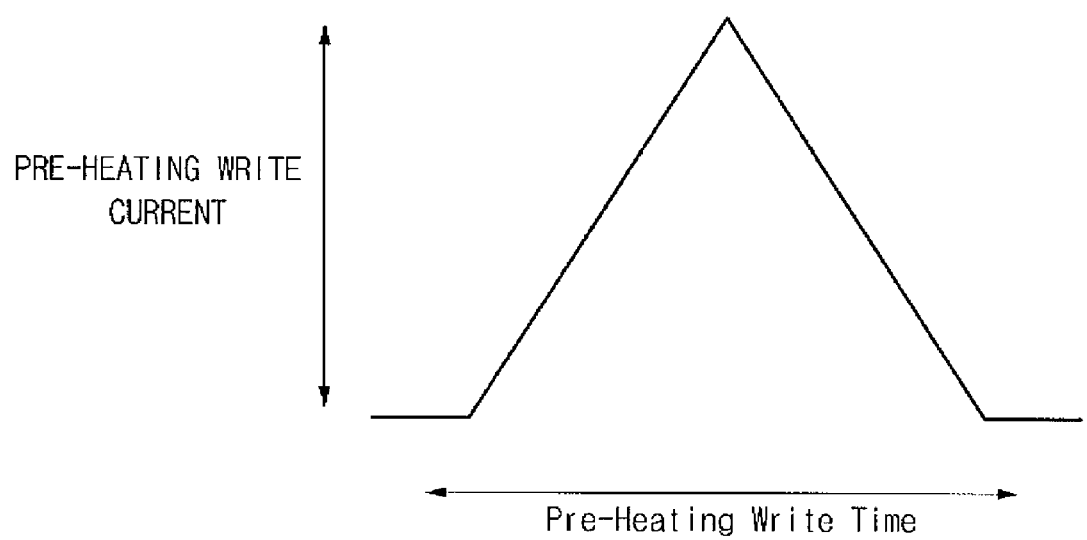
FIG. 9 is a diagram showing an operating waveform of a preheating write current in the driving method of FIG. 8.

When the write control signal W_C is activated, a preheating write current is applied to the unit cell C to preheat the unit cell C as shown in FIG. 9 (step S3). The preheating write current is generated by a driving voltage of the write driving unit W/D. The preheating write current is transmitted as a triangular waveform as shown in FIG. 9, and gradually rises over a given current level. The preheating write current gradually falls after reaching a target current value.

The preheating write current causes a heat annealing effect of the phase change resistor PCR, thereby improving reliability and endurance of the phase change resistor PCR and maintaining a regular initial write condition of the phase change resistor PCR.

When the write control signal W_C is activated, the preheating write current is supplied to the bit line BL so that the phase change resistor PCR of the unit cell C is warmed up. As a result, a first transmitted write condition operates normally.

Whether data to be written to the phase change resistor is set data or reset data is decided in order to determine an individual operation to perform (step S4).

When the data to be written is set data, the write driving unit W/D writes the new set data to the phase change resistor PCR and performs a verification operation on the set data (step S5). That is, a write operation condition is changed several times during the verification operation until the new set data is written normally and verified.

When the data to be written is reset data, the write driving unit W/D writes the new reset data to the phase change resistor PCR and performs a verification operation on the reset data (step S6). That is, a write operation condition is changed several times during the verification operation until the new reset data is written normally and verified.

Figure 10:
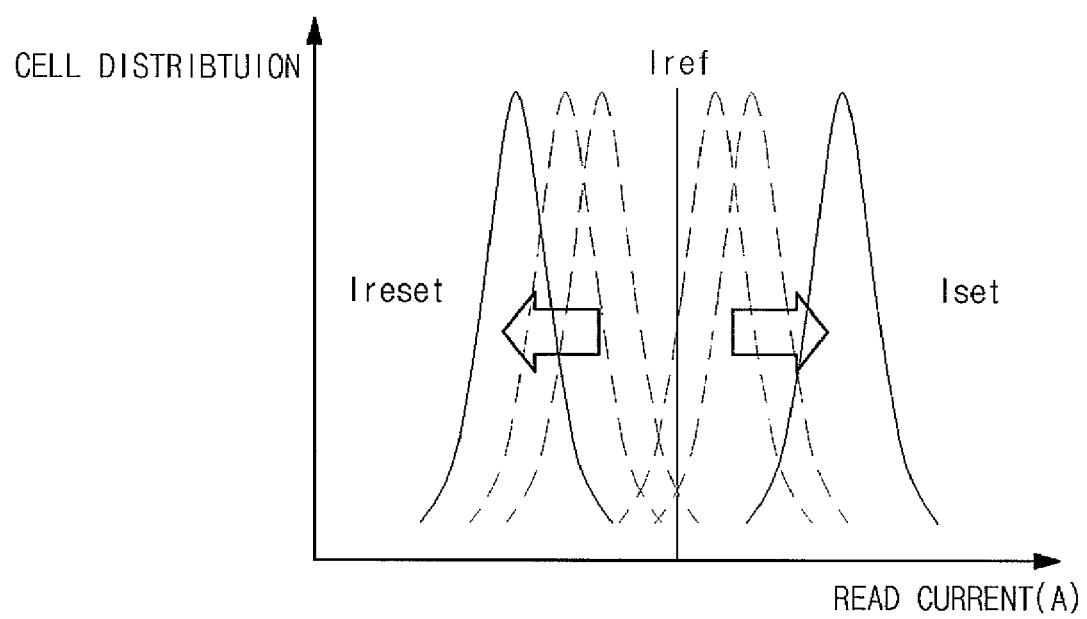
FIG. 10 is a diagram showing a unit cell characteristic distribution for a phase change memory device according to a first embodiment of the present invention.

FIG. 10 is a diagram showing a unit cell characteristic distribution for a phase change memory device according to a first embodiment of the invention.

When a write cycle starts, the original data stored in the unit cell C is read. The data of the unit cell C is selected by the reference current Iref and is read.

In other words, the reset current Ireset flowing through the bit line BL has a read current value lower than that of the reference current Iref. The set current Iset flowing through the bit line BL has a read current value higher than that of the reference current Iref.

In a write mode, set/reset data write operations and set/reset data read operations are repeated several times. When a fail condition occurs based on the reference current Iref, the set/reset write conditions are changed, and the set/reset data is written and verified repeatedly until the changed conditions pass verification.

Although an initial cell write characteristic may be different, the set/reset write conditions are changed to find a normal set/reset write condition for the cell. As a result, it is possible to regulate the distribution of all cells for storing set/reset data to have a pass condition.

Figure 11:
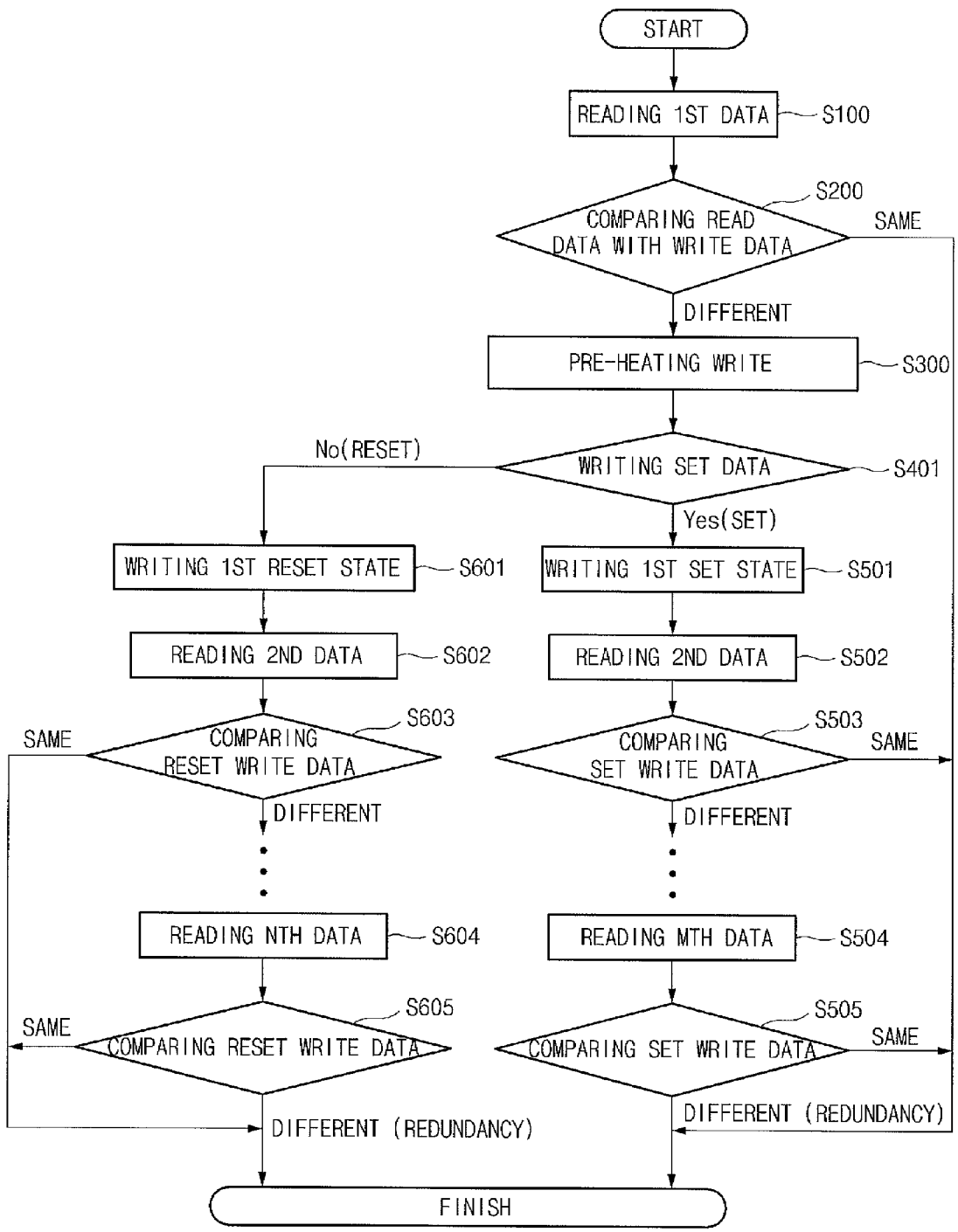
FIG. 11 is a flow chart illustrating a write cycle driving method of a phase change memory device according to a first embodiment of the present invention.

FIG. 11 is a flow chart illustrating a write cycle driving method of a phase change memory device according to a first embodiment of the present invention.

When a write cycle starts, original data stored in the unit cell C is read (step S100). Data of the unit cell C selected by the reference current Iref is read.

The comparing unit 100 compares cell data read in the sense amplifier S/A to write data received from input/output lines I/O (step S200).

When the cell data read in the sense amplifier S/A is identical to the write data received from the input/output lines I/O, the write operation is finished. When the cell data read in the sense amplifier S/A is different from the write data received from the input/output lines I/O, a preheating write current for preheating the unit cell C is applied (step S300).

Whether data to be written to the phase change resistor PCR is set data or reset data is decided in order to determine an individual operation to perform (step S401).

When the data to be written is the set data, the write driving unit W/D writes the new set data to the phase change resistor PCR and performs a verification operation. That is, a write operation condition is changed several times during the verification operation until the new set data is written normally and verified.

The writing and verifying operations of the new set data includes writing, reading, and verifying a plurality of set states until the read cell data is identical to the write data.

That is, a write voltage having a set state is supplied to the bit line BL to write a set state according to a first condition (step S501). The cell data stored in the corresponding unit cell C is then read (step S502).

The comparing unit 100 compares the cell data read from the sense amplifier S/A to the write data received from the input/output lines I/O (step S503). When the cell data read from the sense amplifier S/A is identical to the write data received from the input/output lines I/O, the write operation is finished.

When the cell data read from the sense amplifier S/A is different from the write data received from the input/output lines I/O, a write condition having a set state is changed to write a set state according to a second condition.

Cell data stored in the corresponding unit cell C is then read. The cell data read from the sense amplifier S/A is compared to the set write data received from the input/output lines I/O. When the data is the same, the write operation is finished.

When the cell data read from the sense amplifier S/A is different from the set write data received from the input/output lines I/O, the write condition having a set state is changed to write a set state according to a $m^{th}$ condition.

The $m^{th}$ data stored in the corresponding unit cell C is read according to the reference current Iref (step 5504). The $m^{th}$ set state having the changed write condition is written and read repeatedly.

The cell data is then read from the sense amplifier S/A is compared to the set write data received from the input/output lines I/O (step S505). When the data is the same, the write operation is finished.

When the cell data read from the sense amplifier S/A is different from the set write data received from the input/output lines I/O, the write operation is finished and a redundancy operation is performed. That is, although m write/read operations are repeatedly performed, failed cells are rescued by a redundancy circuit.

When data to be written to the unit cell C is reset data, the write driving unit W/D writes new reset data to the phase change resistor PCR and verifies the data. That is, the write operation condition is changed several times and the verification operation is repeated until the new reset data is written normally and verified.

The writing and verifying operations of the new reset data include writing, reading, and verifying a plurality of reset states until the read cell data is identical to the write data.

That is, a write voltage having a reset state is supplied to the bit line BL to write a reset state according to a first condition (step S601). The cell data stored in the corresponding unit cell C is then read (step S602).

The comparing unit 100 compares the cell data read from the sense amplifier S/A to the write data received from the input/output lines I/O (step S603). When the cell data read from the sense amplifier S/A is identical to the write data received from the input/output lines I/O, the write operation is finished.

When the cell data read from the sense amplifier S/A is different from the write data received from the input/output lines I/O, a write condition having a reset state is changed to write a reset state according to a second condition.

Cell data stored in the corresponding unit cell C is then read according to the reference current Iref. The cell data read from the sense amplifier S/A is compared to the reset write data received from the input/output lines I/O. When the data is the same, the write operation is finished.

When the cell data read from the sense amplifier S/A is different from the reset write data received from the input/output lines I/O, the write condition having a reset state is changed to write a reset state according to an $n^{th}$ condition.

The $n^{th}$ data stored in the corresponding unit cell C is read according to the reference current Iref (step S604). The $n^{th}$ reset state having the changed write condition is written and read repeatedly.

The cell data read from the sense amplifier S/A is compared to the reset write data received from the input/output lines I/O (step S605). When the data is the same, the write operation is finished.

When the cell data read from the sense amplifier S/A is different from the reset write data received from the input/output lines I/O, the write operation is finished and a redundancy operation is performed. That is, although n write/read operations are repeatedly performed, failed cells are rescued by a redundancy circuit.

Figure 12:
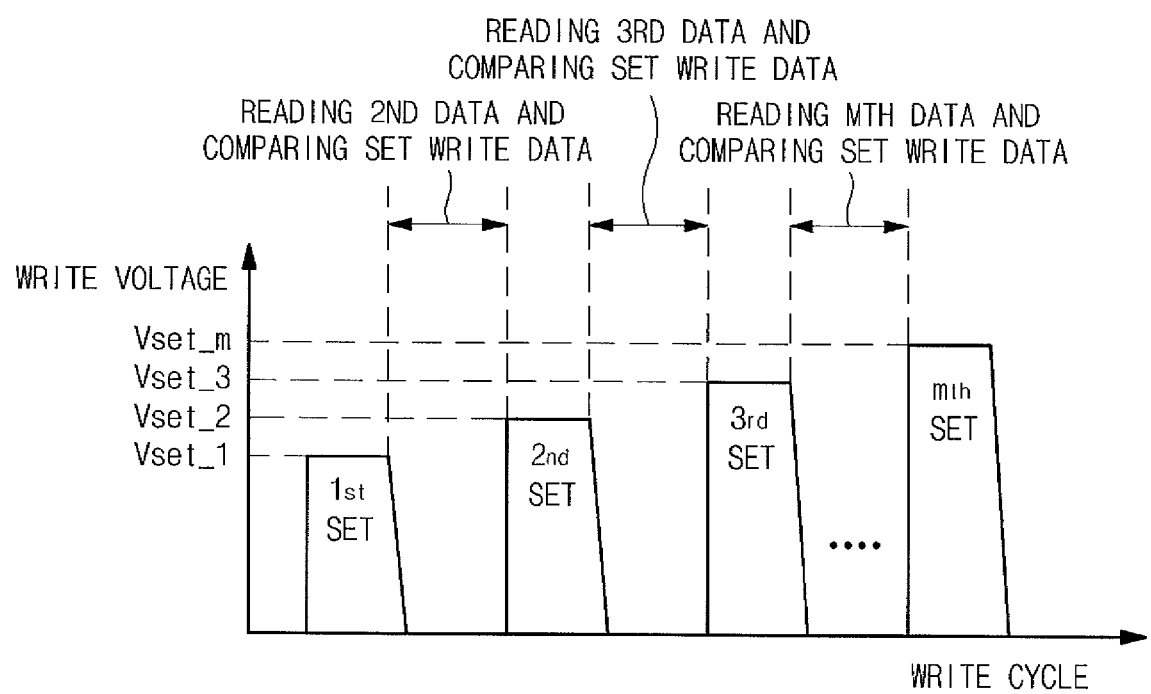
FIG. 12 is a diagram showing a set data write method of a phase change memory device according to a first embodiment of the present invention.

FIG. 12 is a diagram showing a set data write method of a phase change memory device according to a first embodiment of the present invention.

The write driving unit W/D supplies a write voltage Vset_1 having a first set state to write and verify first set data. The second cell data stored in the unit cell C is read according to the reference current Iref. The cell data stored in the unit cell C is compared to the set write data to be written.

When the cell data stored in the unit cell C is different from the set write data to be written, the write driving unit W/D supplies a write voltage Vset_2 having a second set state to write and verify the second set data.

The third cell data stored in the unit cell C is read according to the reference current Iref. The cell data stored in the unit cell C is compared to the set write data to be written.

When the cell data stored in the unit cell C is different from the set write data to be written, the write driving unit W/D supplies a write voltage Vset_3 having a third set state to write and verify the third set data.

The $m^{th}$ cell data stored in the unit cell C is read according to the reference current Iref. The cell data stored in the unit cell C is compared to the set write data to be written.

When the cell data stored in the unit cell C is different from the set write data to be written, the write driving unit W/D supplies a write voltage Vset_m having an $m^{th}$ set state to write and verify the $m^{th}$ set data.

The write voltage Vset_m is larger than the write voltage Vset_3, which is larger than the write voltage Vset_2. The write voltage Vset_2 is larger than the write voltage Vset_1.

A set condition in a set data write cycle consists of a plurality of long pulse times. There are periods for verifying set data and comparing set write data between periods for receiving each set pulse.

While receiving an applied set voltage, the set pulse voltage is gradually increased from the smallest write voltage Vset_1 to the write voltage Vset_m to change the set condition several times during the set data write cycle.

When a data fail occurs in the first set write operation, the write voltage Vset is increased one step, i.e., regulated to perform a second set write operation. In this way, the write voltage Vset_m is increased to the $m^{th}$ step so that set data can be written normally to the failed cells.

Figure 13:
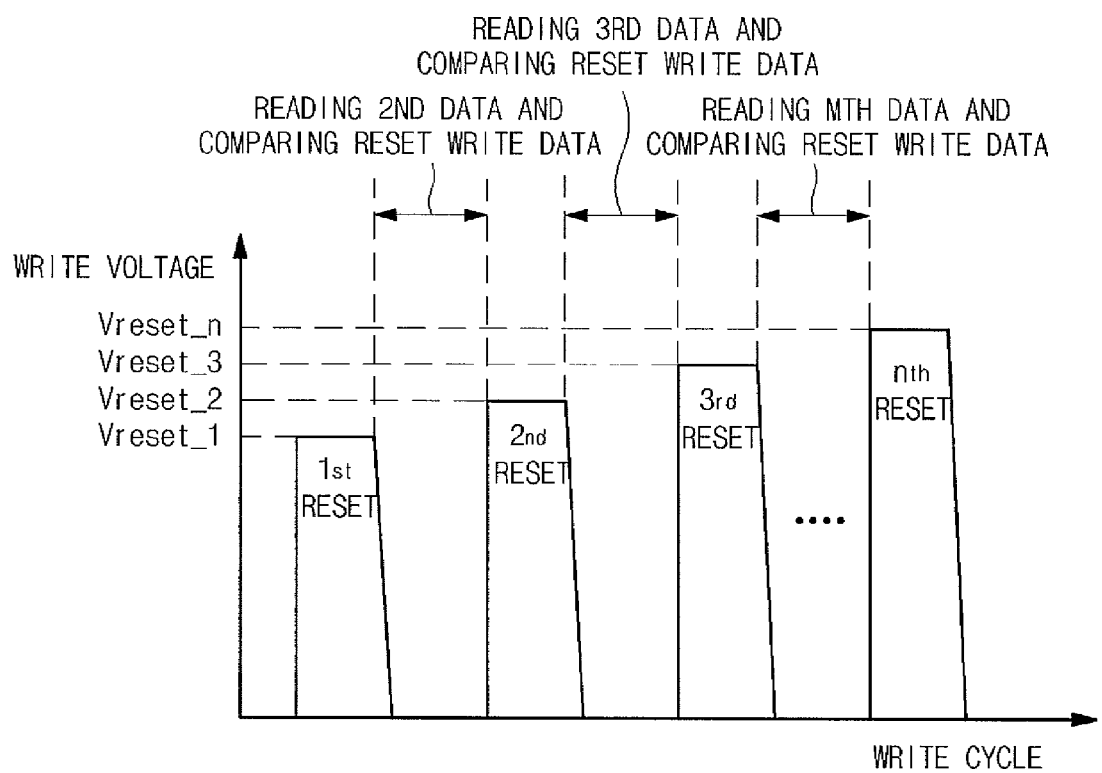
FIG. 13 is a diagram showing a reset data write method of a phase change memory device according to a first embodiment of the present invention.

FIG. 13 is a diagram showing a reset data write method of a phase change memory device according to a first embodiment of the present invention.

The write driving unit W/D supplies a write voltage Vreset_1 having a first reset state to write and verify first reset data. The second cell data stored in the unit cell C is read according to the reference current. The cell data stored in the unit cell C is compared to the reset write data to be written.

When the cell data stored in the unit cell C is different from the reset write data to be written, the write driving unit W/D supplies a write voltage Vreset_2 having a second reset state to write and verify the second reset data.

The third cell data stored in the unit cell C is read according to the reference current. The cell data stored in the unit cell C is compared to the reset write data to be written.

When the cell data stored in the unit cell C is different from the reset write data to be written, the write driving unit W/D supplies a write voltage Vreset_3 having a third reset state to write and verify the third reset data.

The $n^{th}$ cell data stored in the unit cell C is read according to the reference current Iref. The cell data stored in the unit cell C is compared to the reset write data to be written.

When the cell data stored in the unit cell C is different from the reset write data to be written, the write driving unit W/D supplies a write voltage Vreset_n having an $n^{th}$ reset state to write and verify the $n^{th}$ reset data.

The reset write voltage Vreset_n is larger than the write voltage Vreset_3, which is larger than the write voltage Vreset_2. The write voltage Vreset_2 is larger than the write voltage Vreset_1.

A reset condition in a reset data write cycle consists of a plurality of long pulse times. There are periods for verifying reset data and comparing reset write data between periods for receiving each reset pulse.

While receiving an applied reset voltage, the reset pulse voltage is gradually increased from the smallest write voltage Vreset_1 to the write voltage Vreset_n to change the reset condition several times.

When a data fail occurs in the first reset write operation, the write voltage Vreset is increased one step, i.e., regulated to perform a second reset write operation. In this way, the write voltage Vreset_n is increased to the $n^{th}$ step so that reset data can be written normally to the failed cells.

Figure 14:
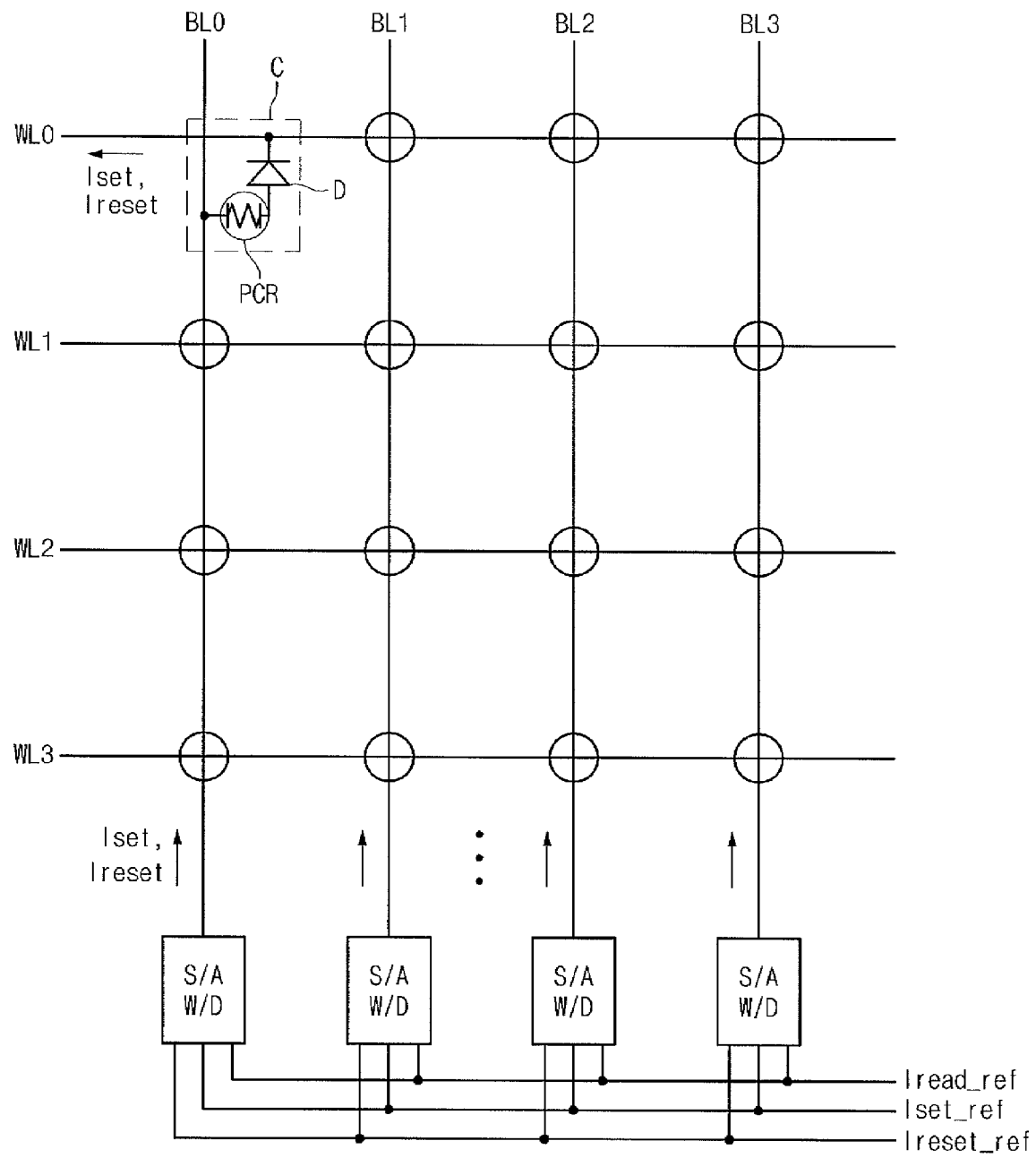
FIG. 14 is a diagram showing a cell array of a phase change memory device according to a second embodiment of the present invention.

FIG. 14 is a diagram showing a cell array of a phase change memory device according to a second embodiment of the present invention.

The phase change memory device includes a plurality of bit lines BL0~BL3 arranged in a row direction and a plurality of word lines WL0~WL3 arranged in a column direction. A unit cell C is arranged at an intersection of the bit lines BL0~BL3 and the word lines WL0~WL3. The unit cell C includes a phase change resistor PCR and a diode D. The diode D includes a PN diode element.

The phase change resistor PCR has one electrode connected to the bit line BL and the other electrode connected to a P-type region of the diode D. A N-type region of the diode D is connected to the word line WL.

A low voltage is applied to a selected word line WL in a read mode. A read voltage Vread is applied to the bit line BL so that a read current Iset having a set state and a read current Ireset having a reset state, flow toward the word line WL through the bit line BL, the phase change resistor PCR, and the diode D.

A sense amplifier S/A compares cell data received from the bit line BL with a read reference current Iread_ref, a set reference current Iset_ref, and a reset reference current Ireset_ref to distinguish between data "1" and "0". A write driving unit W/D supplies a driving voltage that corresponds to write data to the bit line BL when data is to be written to the unit cell C.

The read reference current Iread_ref, the set reference current Iset_ref, and the reset reference current Ireset_ref are currents that flow through reference lines. In a read mode, the read reference current Iread_ref, the set reference current Iset_ref, and the reset reference current Ireset_ref are used for sensing cell currents based on different reference currents in set or reset state write verification operation.

The read reference current Iread_ref is a reference current for reading cell data during a read cycle. The set reference current Iset_ref and the reset reference current Ireset_ref are reference currents used for verifying write data during a write cycle. That is, the set reference current Iset_ref is used for verifying a set write state, and the reset reference current Ireset_ref is used for verifying a reset write state.

The set reference current Iset_ref has the largest current value, while the reset reference current Ireset_ref has the smallest current value. The read reference current has a current value between the set reference current Iset_ref and the reset reference current Ireset_ref.

Figure 15:
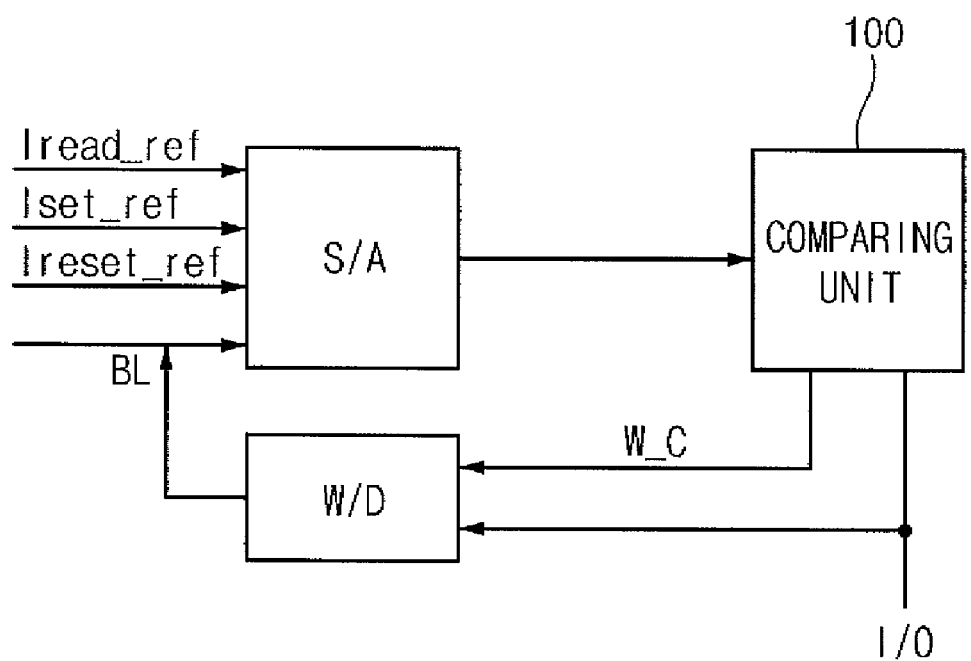
FIG. 15 is a diagram showing a sense amplifier, a write driving unit and a comparing unit of FIG. 14.

FIG. 15 is a diagram showing a sense amplifier, a write driving unit, and a comparing unit 200 of FIG. 14.

The sense amplifier S/A compares cell data received through the bit line BL to the read reference current Iread_ref, the set reference current Iset_ref, and the reset reference current Ireset_ref. The write driving unit W/D supplies a driving voltage that corresponds to the write data to the bit line BL when data is to be written to the cell. The comparing unit 200 compares cell read data outputted from the sense amplifier S/A with write data received from input/output lines I/O and outputs a write control signal W_C.

The comparing unit 200 deactivates the write control signal W_C when the cell read data outputted from the sense amplifier S/A is identical to the write data received from the input/output lines I/O. When the write control signal W_C is deactivated, operation of the write driving unit W/D is stopped.

The comparing unit 200 activates the write control signal W_C when the cell read data outputted from the sense amplifier S/A is different from the write data received from the input/output lines I/O. When the write control signal W_C is activated, the write driving unit W/D operates and writes new data through the bit line BL to the unit cell C.

Figure 16:
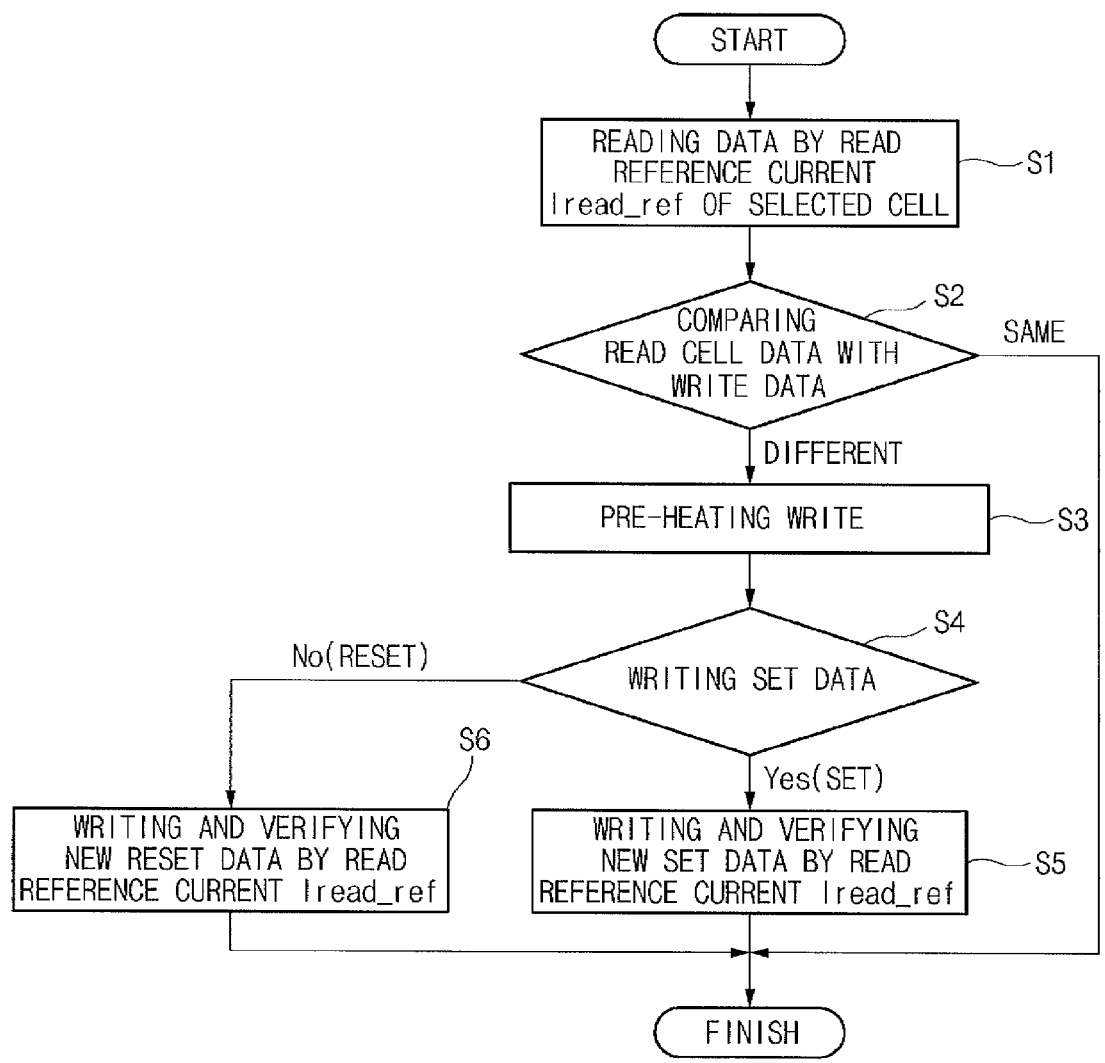
FIG. 16 is a flow chart illustrating a write cycle driving method of a phase change memory device according to a second embodiment of the present invention.

FIG. 16 is a flow chart illustrating a write cycle driving method of a phase change memory device according to a second embodiment of the present invention.

When a write cycle starts, original data stored in the unit cell C is read (step S1). Data of the unit cell C selected by the read reference current Iread_ref is read. The sense amplifier S/A compares the read reference current Iread_ref to cell data received through the bit line BL and amplifies the data.

That is, a low voltage is applied to the selected word line WL during a read mode. A read voltage Vread is transmitted to the bit line BL so that the set current Iset or the reset current Ireset flows towards the word line WL through the bit line BL, the phase change resistor PCR, and the diode D.

The comparing unit 200 compares read the cell data read in the sense amplifier S/A to the write data received from the input/output lines I/O and outputs the write control signal W_C (step S2).

The comparing unit 200 deactivates the write control signal W_C when the cell data outputted from the sense amplifier S/A has a logic value identical to that of the write data received from the input/output lines I/O. When the write control signal W_C is deactivated, the write driving unit W/D is stopped and does not write any new data.

When the data outputted from the sense amplifier S/A is identical to the write data received from the input/output lines I/O, the data to be written is already stored in the cell such that a new write operation does not need to be performed. As a result, the number of reset and set write operations can be reduced.

The comparing unit 200 activates the write control signal W_C when the cell data outputted from the sense amplifier S/A is not identical to a logic value of write data received from the input/output lines I/O. When the write control signal W_C is activated, the write driving unit W/D operates and writes new data through the bit line BL. The write driving unit W/D supplies a driving voltage that corresponds to write data to the bit line BL.

When the write control signal W_C is activated, a preheating write current is applied to the unit cell C to preheat the unit cell C as shown in FIG. 9 (step S3). The preheating write current is generated by a driving voltage of the write driving unit W/D. The preheating write current is transmitted as a triangular waveform as shown in FIG. 9, and gradually rises over a given current level. The preheating write current gradually falls after reaching a target current value.

The preheating write current causes a heat annealing effect of the phase change resistor PCR, thereby improving reliability and endurance of the phase change resistor PCR and maintaining a regular initial write condition of the phase change resistor PCR.

When the write control signal W_C is activated, the preheating write current is supplied to the bit line BL so that the phase change resistor PCR of the unit cell C is warmed up. As a result, a first transmitted write condition operates normally.

Whether data to be written to the phase change resistor is set data or reset data is decided in order to determine an individual operation to perform (step S4).

When the data to be written is set data, the write driving unit W/D writes the new set data to the phase change resistor PCR and performs a verification operation on the set data (step S5). That is, a write operation condition is changed according to the set reference current Iset_ref several times during the verification operation until the new set data is written normally and verified.

When the data to be written is reset data, the write driving unit W/D writes the new reset data to the phase change resistor PCR and performs a verification operation on the reset data according to the reset reference current Ireset_ref (step S6). That is, a write operation condition is changed according to the reset reference current Ireset_ref several times during the verification operation until the new reset data is written normally and verified.

Figure 17:
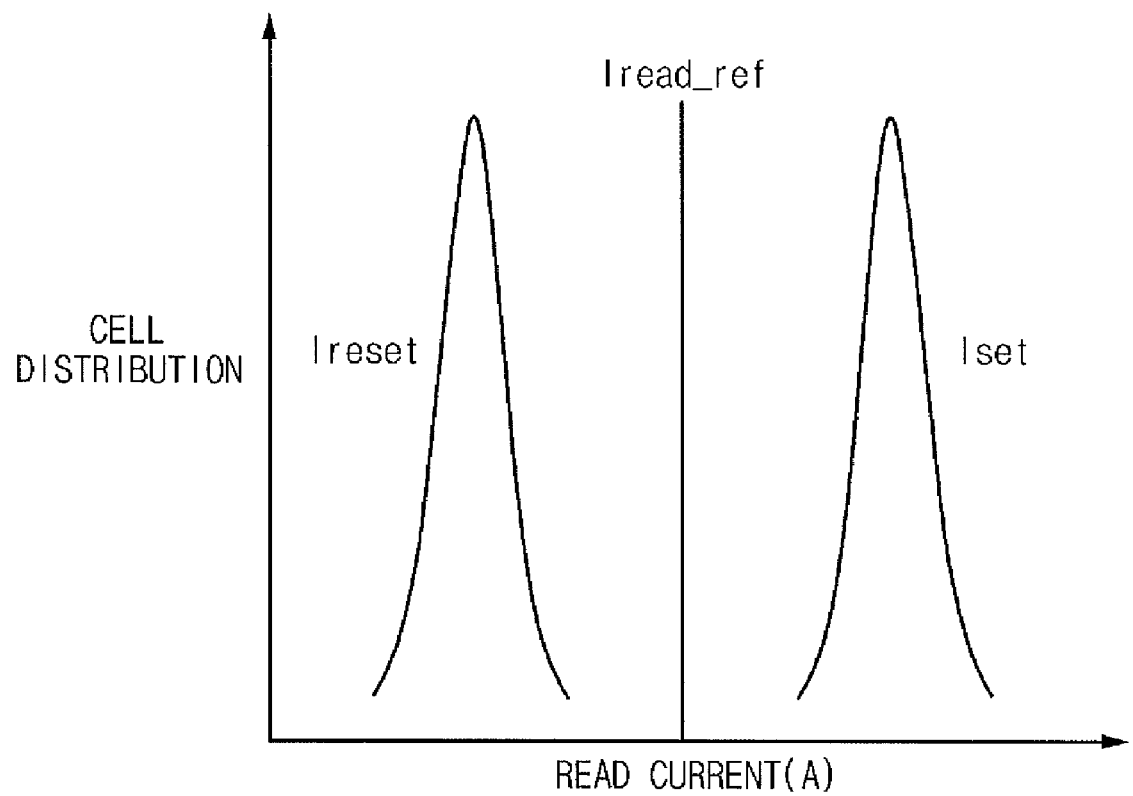
FIG. 17 is a diagram showing a unit cell characteristic distribution for a read cycle of a phase change memory device according to a second embodiment of the present invention.

FIG. 17 is a diagram showing a unit cell characteristic distribution for a read cycle of a phase change memory device according to a second embodiment of the present invention.

When a write cycle starts, the original data stored in the unit cell C is read. The data of the unit cell C is selected by the read reference current Iread_ref and is read.

The reset current Ireset flowing through the bit line BL has a value lower than that of the read reference current Iread_ref. The set current Iset flowing through the bit line BL has a value higher than that of the read reference current Iread_ref.

Figure 18:
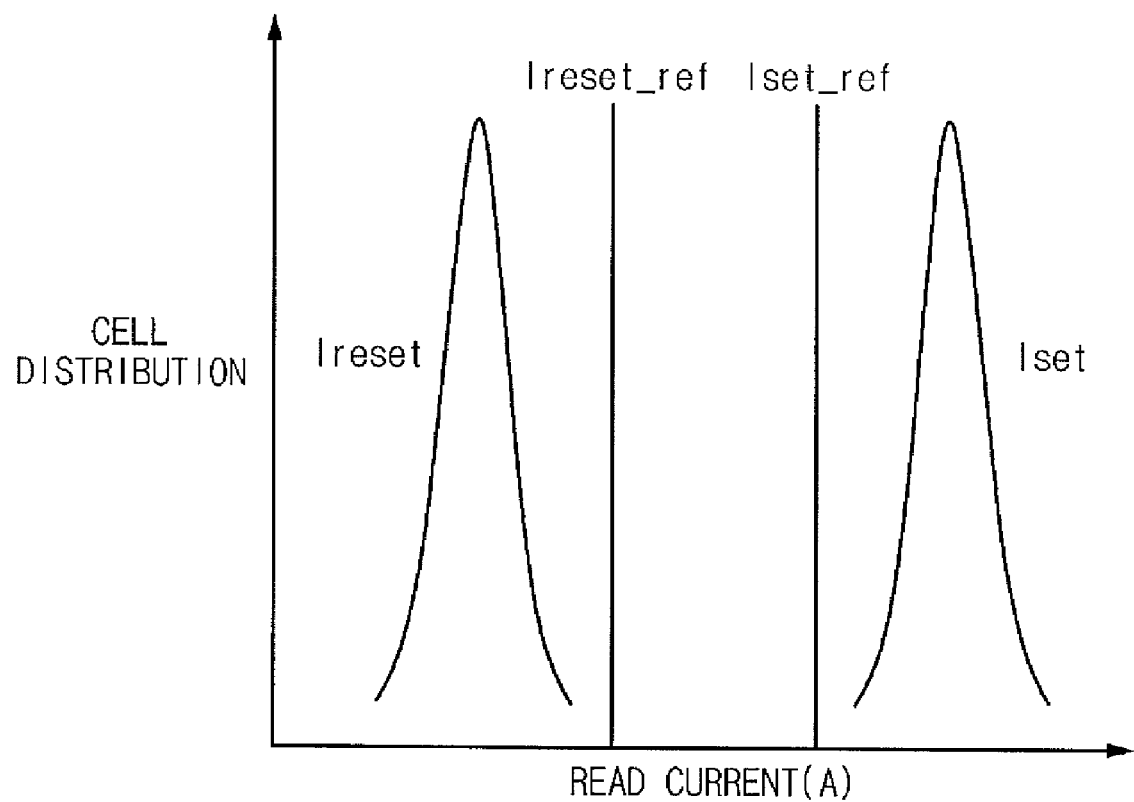
FIG. 18 is a diagram showing a unit cell characteristic distribution for write verification of a phase change memory device according to a second embodiment of the present invention.

FIG. 18 is a diagram showing a unit cell characteristic distribution of the reset reference current Ireset_ref and the set reference current Iset_ref for write verification of a phase change memory device according to a second embodiment of the present invention.

When data to be written is set data, the write driving unit W/D writes new set data to the phase change resistor PCR and performs a verification operation according to the set reference current Iset_ref. The set current Iset has a value larger than the set reference current Iset_ref.

In a set write mode, a set data write operation and a read operation according to the set reference current Iset_ref are repeated several times. When a fail condition occurs based on the set reference current Iset_ref, the set write condition is changed, and the set data is written and verified repeatedly until the changed conditions pass verification.

Although an initial cell write characteristic may be different, the set write condition is changed to find a normal set write condition for the cell. As a result, it is possible to regulate the distribution of all cells for storing set data to have a pass condition.

When data to be written is reset data, the write driving unit W/D writes new reset data to the phase change resistor PCR and performs a verification operation according to the reset reference current Ireset_ref. The reset current Ireset has a value smaller than the reset reference current Ireset_ref.

In a reset write mode, a reset data write operation and a read operation according to the reset reference current Ireset_ref are repeated several times. When a fail condition occurs based on the reset reference current Ireset_ref, the reset write condition is changed, and the reset data is written and verified repeatedly until the changed conditions pass verification.

Although an initial cell write characteristic may be different, the reset write condition is changed to find a normal reset write condition for the cell. As a result, it is possible to regulate the distribution of all cells for storing reset data to have a pass condition.

Figure 19:
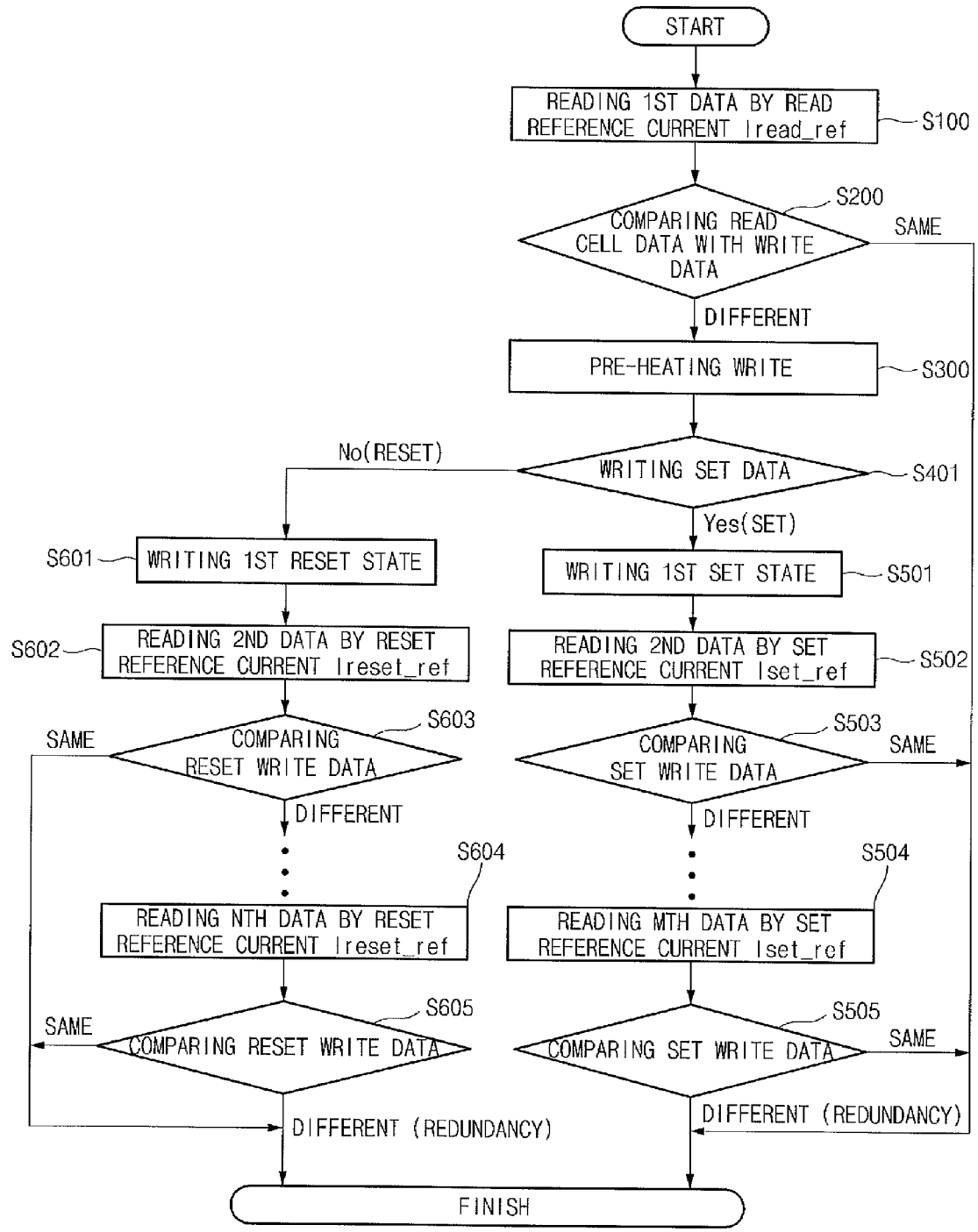
FIG. 19 is a flow chart illustrating a write cycle driving method of a phase change memory device according to a second embodiment of the present invention.

FIG. 19 is a flow chart illustrating a write cycle driving method of a phase change memory device according to a second embodiment of the present invention.

When a write cycle starts, original data stored in the unit cell C is read (step S100). Data of the unit cell C selected by the read reference current Iread_ref is read.

The comparing unit 200 compares cell data read in the sense amplifier S/A to write data received from input/output lines I/O (step S200).

When the cell data read in the sense amplifier S/A is identical to the write data received from the input/output lines I/O, the write operation is finished. When the cell data read in the sense amplifier S/A is different from the write data received from the input/output lines I/O, a preheating write current for preheating the unit cell C is applied (step S300).

Whether data to be written to the phase change resistor PCR is set data or reset data is decided in order to determine an individual operation to perform (step S401).

When the data to be written is the set data, the write driving unit W/D writes the new set data to the phase change resistor PCR and performs a verification operation according to the set reference current Iset_ref. That is, a write operation condition is changed according to the set reference current Iset_ref several times during the verification operation until the new set data is written normally and verified.

The writing and verifying operations of the new set data includes writing, reading, and verifying a plurality of set states according to the set reference current Iset_ref until the read cell data is identical to the write data.

That is, a write voltage having a set state is supplied to the bit line BL to write a set state according to a first condition (step S501). The cell data stored in the corresponding unit cell C is then read according to the set reference current Iset_ref (step S502).

The comparing unit 200 compares the cell data read from the sense amplifier S/A to the write data received from the input/output lines I/O (step S503). When the cell data read from the sense amplifier S/A is identical to the write data received from the input/output lines I/O, the write operation is finished.

When the cell data read from the sense amplifier S/A is different from the write data received from the input/output lines I/O, a write condition having a set state is changed to write a set state according to a second condition.

Cell data stored in the corresponding unit cell C is then read according to the set reference current Iset_ref. The cell data read from the sense amplifier S/A is compared to the set write data received from the input/output lines I/O. When the data is the same, the write operation is finished.

When the cell data read from the sense amplifier S/A is different from the set write data received from the input/output lines I/O, the write condition having a set state is changed to write a set state according to a $m^{th}$ condition.

The $m^{th}$ data stored in the corresponding unit cell C is read according to the set reference current Iset_ref (step S504). The $m^{th}$ set state having the changed write condition is written and read repeatedly.

The cell data is then read from the sense amplifier S/A is compared to the set write data received from the input/output lines I/O (step S505). When the data is the same, the write operation is finished.

When the cell data read from the sense amplifier S/A is different from the set write data received from the input/output lines I/O, the write operation is finished and a redundancy operation is performed. That is, although m write/read operations are repeatedly performed, failed cells are rescued by a redundancy circuit.

When data to be written to the unit cell C is reset data, the write driving unit W/D writes new reset data to the phase change resistor PCR and verifies the data according to the reset reference current Ireset_ref. That is, the write operation condition is changed according to the reset reference current Ireset_ref several times and the verification operation is repeated until the new reset data is written normally and verified.

The writing and verifying operations of the new reset data includes writing, reading, and verifying a plurality of reset states according to the reset reference current Ireset_ref until the read cell data is identical to the write data.

That is, a write voltage having a reset state is supplied to the bit line BL to write a reset state according to a first condition (step S601). The cell data stored in the corresponding unit cell C is read according to the reset reference current Ireset_ref (step S602).

The comparing unit 200 compares the cell data read from the sense amplifier S/A to the write data received from the input/output lines I/O (step S603). When the cell data read from the sense amplifier S/A is identical to the write data received from the input/output lines I/O, the write operation is finished.

When the cell data read from the sense amplifier S/A is different from the write data received from the input/output lines I/O, a write condition having a reset state is changed to write a reset state according to a second condition.

Cell data stored in the corresponding unit cell C is then read according to the reset reference current Ireset_ref. The cell data read from the sense amplifier S/A is compared with the reset write data received from the input/output lines I/O. When the data is the same, the write operation is finished.

When the cell data read from the sense amplifier S/A is different from the reset write data received from the input/output lines I/O, the write condition having a reset state is changed to write a reset state according to an $n^{th}$ condition.

The $n^{th}$ data stored in the corresponding unit cell C is read according to the reset reference current Ireset_ref (step S604). The $n^{th}$ reset state having the changed write condition is written and read repeatedly.

The cell data read from the sense amplifier S/A is compared to the reset write data received from the input/output lines I/O (step S605). When the data is the same, the write operation is finished.

When the cell data read from the sense amplifier S/A is different from the reset write data received from the input/output lines I/O, the write operation is finished and a redundancy operation is performed. That is, although n write/read operations are repeatedly performed, failed cells are rescued by a redundancy circuit.

Figure 20:
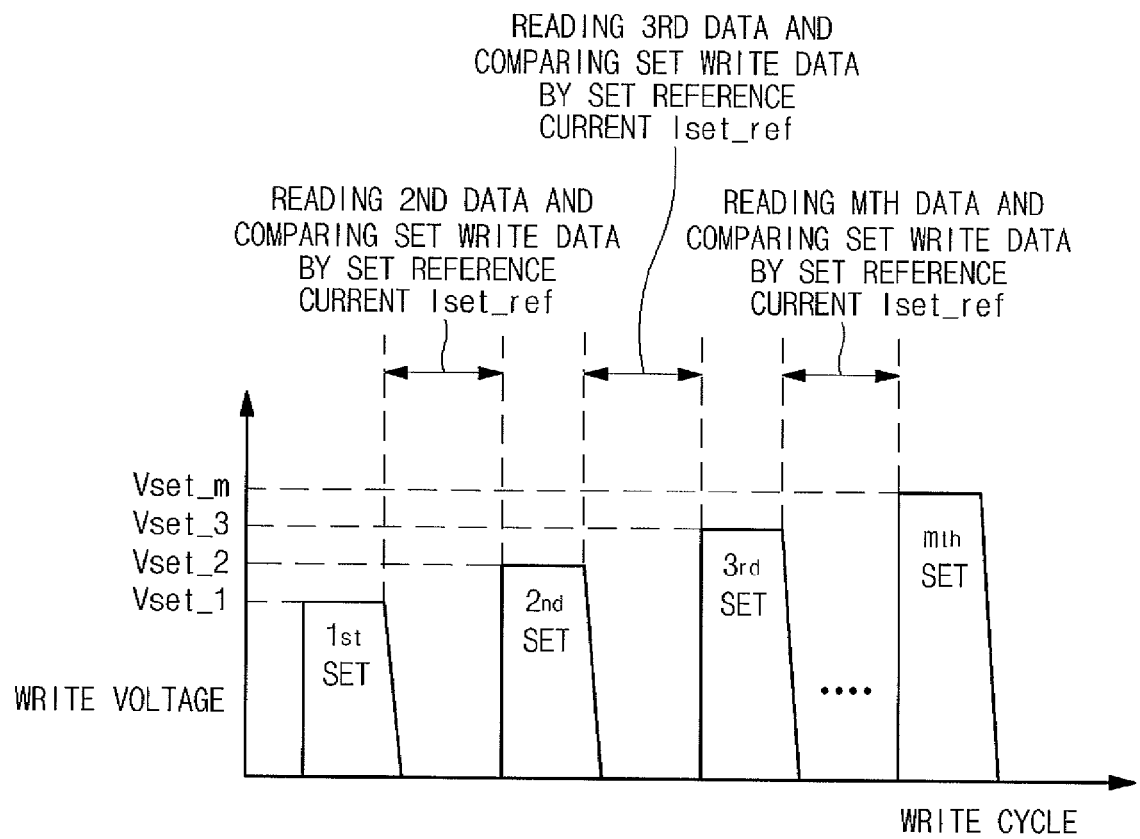
FIG. 20 is a diagram showing a set data write method of a phase change memory device according to a second embodiment of the present invention.

FIG. 20 is a diagram showing a set data write method of a phase change memory device according to a second embodiment of the present invention.

The write driving unit W/D supplies a write voltage Vset_1 having a first set state to write and verify first set data. The second cell data stored in the unit cell C is read according to the set reference current Iset_ref. The cell data stored in the unit cell C is compared to the set write data to be written.

When the cell data stored in the unit cell C is different from the set write data to be written, the write driving unit W/D supplies a write voltage Vset_2 having a second set state to write and verify the second set data.

The third cell data stored in the unit cell C is read according to the set reference current Iset_ref. The cell data stored in the unit cell C is compared to the set write data to be written.

When the cell data stored in the unit cell C is different from the set write data to be written, the write driving unit W/D supplies a write voltage Vset_3 having a third set state to write and verify the third set data.

The $m^{th}$ cell data stored in the unit cell C is read according to the set reference current Iset_ref. The cell data stored in the unit cell C is compared to the set write data to be written.

When the cell data stored in the unit cell C is different from the set write data to be written, the write driving unit W/D supplies a write voltage Vset_m having an $m^{th}$ set state to write and verify the $m^{th}$ set data.

The write voltage Vset_m is larger than the write voltage Vset_3, which is larger than the write voltage Vset_2. The write voltage Vset_2 is larger than the write voltage Vset_1.

A set condition in a set data write cycle consists of a plurality of long pulse times. There are periods for verifying set data and comparing set write data according to the set reference current Iset_ref between periods for receiving each set pulse.

While receiving an applied set voltage, the set pulse voltage is gradually increased from the smallest write voltage Vset_1 to the write voltage Vset_m to change the set condition several times during the set data write cycle.

When a data fail occurs in the first set write operation based on the set reference current Iset_ref, the write voltage Vset is increased one step, i.e., regulated to perform a second set write operation. In this way, the write voltage Vset_m is increased to the $m^{th}$ step so that set data can be written normally to the failed cells.

Figure 21:
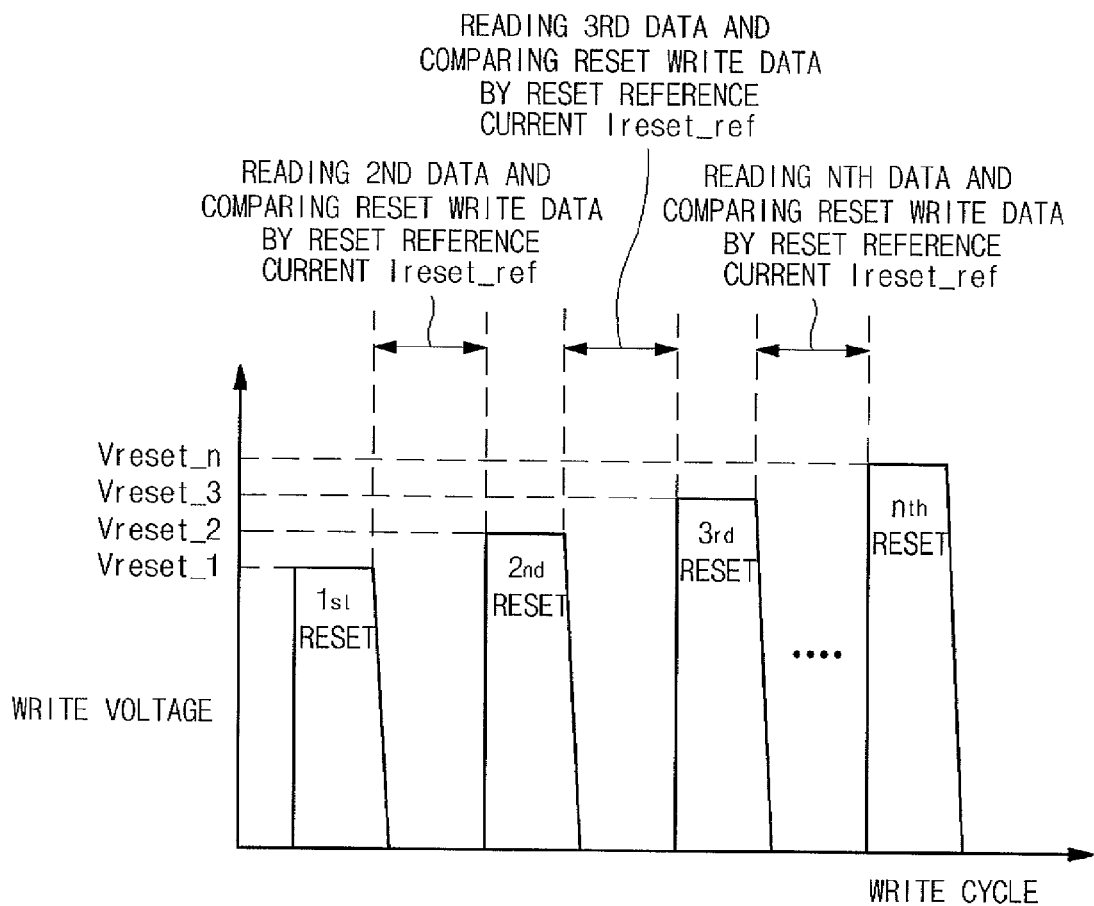
FIG. 21 is a diagram showing a reset data write method of a phase change memory device according to a second embodiment of the present invention.

FIG. 21 is a diagram showing a reset data write method of a phase change memory device according to a first embodiment of the present invention.

The write driving unit W/D supplies a write voltage Vreset_1 having a first reset state to write and verify first reset data. The second cell data stored in the unit cell C is read according to the reset reference current Ireset_ref. The cell data stored in the unit cell C is compared to the reset write data to be written.

When the cell data stored in the unit cell C is different from the reset write data to be written, the write driving unit W/D supplies a write voltage Vreset_2 having a second reset state to write and verify the second reset data.

The third cell data stored in the unit cell C is read according to the reset reference current Ireset_ref. The cell data stored in the unit cell C is compared to the reset write data to be written.

When the cell data stored in the unit cell C is different from the reset write data to be written, the write driving unit W/D supplies a write voltage Vreset_3 having a third reset state to write and verify the third reset data.

The $n^{th}$ cell data stored in the unit cell C is read according to the reset reference current Ireset_ref. The cell data stored in the unit cell C is compared to the reset write data to be written.

When the cell data stored in the unit cell C is different from the reset write data to be written, the write driving unit W/D supplies a write voltage Vreset_n having an $n^{th}$ reset state to write and verify the $n^{th}$ reset data.

The reset write voltage Vreset_n is larger than the write voltage Vreset_3, which is larger than the write voltage Vreset_2. The write voltage Vreset_2 is larger than the write voltage Vreset_1.

A reset condition in a reset data write cycle consists of a plurality of long pulse times. There are periods for verifying reset data and comparing reset write data to the reset reference current Ireset_ref between periods for receiving each reset pulse.

While receiving an applied reset voltage, the reset pulse voltage is gradually increased from the smallest write voltage Vreset_1 to the write voltage Vreset_n to change the reset condition several times.

When a data fail occurs in the first reset write operation based on the reset reference current Ireset_ref, the write voltage Vreset is increased one step, i.e., regulated to perform a second reset write operation. In this way, the write voltage Vreset_n is increased to the $n^{th}$ step so that reset data can be written normally to the failed cells.

As described above, a method according to the present invention reduces the number of reset and set operations occurring in a phase change memory device including a phase change resistor to improve a write operation characteristic.

The method according to the present invention induces stable set and reset write states during a write mode.

The method according to the present invention stably drives set and reset write states to improve the reliability of cells and a read sensing current margin.

The method according to the present invention changes a write condition when an initial cell's write characteristic is different in order to obtain a normal set/reset write condition.

The method according to the present invention sets a value of a set reference current different from that of a reset reference current that is used for verifying a set write state to induce stable set and reset write states during a write mode.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:

1. A method for driving a phase change memory device having a phase change resistor and sensing a change in a crystallization state of the phase change resistor according to currents applied to the phase change resistor to store data corresponding to the crystallization state, the method comprising:

reading cell data of a selected cell according to a reference current;

comparing the cell data with a write data;

deciding whether the write data is a set data or a reset data when the cell data is different from the write data;

preheating the phase change resistor by supplying a preheating write current to the phase change resistor when the cell data is different from the write data; and writing and verifying a set state to the cell when the write data is a set data, and writing and verifying a reset state to the cell when the write data is a reset data.

2. The method according to claim 1, wherein the writing and verifying step comprises:

writing a set write data to the cell;

reading the cell data stored in the cell; and comparing the cell data to the set write data.

3. The method according to claim 2, further comprising the step of:

repeating the writing step, the reading step, and the comparing step.

4. The method according to claim 2, wherein the writing and verifying step is repeated until the cell data is identical to the set write data.

5. The method according to claim 1, wherein the writing and verifying step comprises:

changing a set state condition for the write data.

6. The method according to claim 5, wherein the writing and verifying step further comprises the step of:

writing the set data to the cell by adjusting a level of a set write voltage while maintaining a constant write time for the set data.

7. The method according to claim 1, wherein the writing and verifying step comprises:

increasing a write voltage sequentially for writing the set data.

8. The method according to claim 1, wherein the writing and verifying step comprises:

writing a reset write data to the cell;

reading the cell data stored in the cell; and comparing the cell data to the reset write data.

9. The method according to claim 8, further comprising the step of:

repeating the writing step, the reading step, and the comparing step.

10. The method according to claim 8, wherein the writing and verifying step is repeated until the cell data is identical to the reset write data.

11. The method according to claim 1, wherein the writing and verifying step comprises:

changing a reset state condition for the write data.

12. The method according to claim 11, wherein the writing and verifying step further comprises the step of:

writing the reset data to the cell by adjusting a level of a reset write voltage while maintaining a constant write time for the reset data.

13. The method according to claim 1, wherein the writing and verifying step comprises:

increasing a write voltage sequentially for writing the reset data.

14. The method according to claim 1, wherein the preheating step is performed after comparing the cell data with the write data.

15. The method according to claim 1, wherein the preheating write current is applied to the phase change resistor as a triangular waveform.

16. A method for driving a phase change memory device having a phase change resistor and sensing a change in a crystallization state of the phase change resistor according to currents applied to the phase change resistor to store data corresponding to the crystallization state, the method comprising:

reading cell data of a selected cell according to a read reference current;

comparing the cell data with a write data;

deciding whether the write data is a set data or a reset data when the cell data is different from the write data;

preheating the phase change resistor by supplying a preheating write current to the phase change resistor when the cell data is different from the write data; and writing and verifying a set state to the cell according to a set reference current when the write data is a set data, and writing and verifying a reset state to the cell according to a reset reference current when the write data is a reset data.

17. The method according to claim 16, wherein the read reference current, the set reference current, and the reset reference current have different current values.

18. The method according to claim 17, wherein the read reference current has a current value greater than the reset reference current and smaller than the set reference current.

19. The method according to claim 17, wherein the set reference current has a current value smaller than a set current.

20. The method according to claim 17, wherein the reset reference current has a current value greater than the reset current.

21. The method according to claim 17, wherein the set reference current has a current value greater than the reset reference current.

22. The method according to claim 16, wherein the writing and verifying step comprises:

writing a set write data to the cell;
reading the cell data stored in the cell according to the set reference current; and
comparing the cell data to the set write data.

23. The method according to claim 16, wherein the writing and verifying step comprises:

writing a reset write data to the cell;
reading the cell data stored in the cell according to the reset reference current; and
comparing the cell data to the reset write data.

* * * * *